United States Patent [19]
Eastwood et al.

[11] 3,936,790
[45] Feb. 3, 1976

[54] TEMPERATURE SENSITIVE RESISTOR HAVING A CRITICAL TRANSITION TEMPERATURE OF ABOUT 140°C

[75] Inventors: H. Keith Eastwood, Beaconsfield; Thomas R. Simon, Cote St. Luc; Nguyen N. Khoi, Montreal, all of Canada

[73] Assignee: Multi-State Devices, Ltd., Dorval, Canada

[22] Filed: Aug. 26, 1974

[21] Appl. No.: 500,732

[30] Foreign Application Priority Data
July 22, 1974 Canada .................................. 205362

[52] U.S. Cl. ................ 338/25; 252/518; 338/22 SD
[51] Int. Cl.² ............................................ H01C 7/00
[58] Field of Search ........ 338/22 R, 22 SD, 25, 309; 252/518; 357/28; 423/592

[56] References Cited
UNITED STATES PATENTS

| | | | |
|---|---|---|---|
| 2,884,508 | 4/1959 | Czipott et al. | 338/309 X |
| 3,295,087 | 12/1966 | Landis et al. | 338/22 R X |
| 3,402,131 | 9/1968 | Futaki et al. | 338/22 R X |
| 3,452,314 | 6/1969 | Sapoff et al. | 338/309 X |
| 3,650,680 | 3/1972 | Teeg et al. | 423/592 |

*Primary Examiner*—C. L. Albritton
*Attorney, Agent, or Firm*—Spencer & Kaye

[57] ABSTRACT

A solid state switching device comprises a temperature sensitive resistive element of $V_3O_5$ material which exhibits an abrupt decrease in electrical resistance at about 140°C and electrode lead wires attached to spaced points of such temperature sensitive resistive element for connecting the temperature sensitive resistive element to an electrical circuit.

6 Claims, 5 Drawing Figures

TEMPERATURE SENSITIVE RESISTOR HAVING A CRITICAL TRANSITION TEMPERATURE OF ABOUT 140°C

This invention relates to a solid state switching device made of temperature sensitive resistive material and to a method for making it.

A number of transition metal compounds are known to exhibit an abrupt change in electrical resistance at some characteristic temperature. The usefulness of such materials as electrical switching devices or temperature sensors depends on having a reproducible and reversible abrupt change in electrical resistance. Because of their low transition temperatures, $V_2O_3$ (−100°C) and $Fe_3O_4$ (−150°C) require cryogenic cooling. $VO_2$ has found extensive application because its transition temperature of 65°C requires no special cooling device.

For may applications, electronic devices such as power transistors are rated for operation at temperatures up to 125°C and, consequently, a device having a transition temperature higher than 65°C would be required. The only known materials having substantial resistance changes in the temperature range 100°-200°C are positive temperature coefficient (P.T.C) materials based on $BaTiO_3$ and the negative temperature coefficient (N.T.C.) $Ag_2S$ and $Ti_3O_5$ materials. The devices made of P.T.C. materials are limited to low frequency applications because P.T.C. materials have an inherently large shunt capacitance and also because their impedance is voltage sensitive. Experimental devices have been made using the latter two materials and they are subject to different failure mechanisms. $Ag_2S$ is an ionic conductor and undergoes irreversible changes when direct current is passed between the electrodes of a device made of such material. $Ti_3O_5$ has a transition at 175° which is accompanied by a large volume change (10 percent) which leads to cracking and devices using it fail for this reason. Many workers have also tried to raise the transition temperature of $VO_2$ materials by adding dopants thereto. However, the doped $VO_2$ devices are still limited in their range of application to a maximum temperature of about 90°C.

After investigation of various forms of transition metal oxides, applicant has surprisingly found that if $VO_2$ is annealed at a temperature higher than 600°C in a reducing atmosphere of $CO_2$: $H_2$ or CO: $CO_2$ mixtures, then a reduced form of vanadium oxide is obtained which has an abrupt drop in electrical resistance at about 140°C. A typical annealing process would consist of heating the $VO_2$ material at 1000°C for 30 minutes in an ambient atmosphere of 5000 p.p.m. $H_2$ in $CO_2$. This reduced vanadium oxide has been analyzed crystallographically by x-ray diffraction techniques and has been identified as $V_3O_5$. The temperature sensitive devices made from this material show no sign of failure by ionic conduction or by cracking. It is to be understood that $V_3O_5$ could also be made by an oxidation process instead of the above disclosed reduction process.

In a preferred embodiment of the invention, the $V_3O_5$ temperature sensitive resistive element is in the form of a thin film obtained by depositing $VO_2$ on an insulating substrate and annealing it in accordance with the above disclosed method but it will be understood that similar devices could be made in the form of either a single crystal, a polycrystalline aggregate, a sintered powder, or a thick film paste. When made in the form of a thin film, electrical contact pads are deposited on spaced points of the temperature sensitive resisitive element, and the electrode lead wires are welded to such contact pads. When made in other forms, the electrode lead wires may be inserted directly into the temperature sensitive resisitive element or attached by conductive epoxy.

The insulating substrate may be made of single crystal quartz or other refractory materials.

The resistive element of $V_3O_5$ may be doped with suitable doping materials to increase or decrease its transition temperature. It has been found that doping with germanium may advantageously lower the transition temperature in the range of 100°-140°C. For example, doping with about 2 percent germanium has reduced the transition temperature to about 120°C.

The invention will now be disclosed, by way of example, with reference to a preferred embodiment of the invention illustrated in the accompanying drawings in which.

Figure 1:
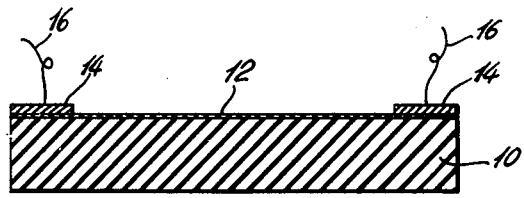
FIG. 1 illustrates a temperature sensitive resistive element in the form of a thin film.

Referring to FIG. 1, there is shown a substrate 10 having a thickness of about 0.010 inch and made of a suitable material such as single crystal quartz or sapphire upon which is deposited a film of $VO_2$ material 12 a few thousand angstroms thick. The film may be deposited by well known sputtering techniques such as the one disclosed in U.S. patent application Ser. No. 335,651 filed Feb. 26, 1973 by the same assignee as the present application. The film $VO_2$ material is then reduced to $V_3O_5$ by annealing at a temperature higher than 600°C in a reducing gas atmosphere such as $CO_2$: $H_2$ or CO: $CO_2$ mixtures. A typical annealing process would consist of heating the film at 1000°C for 30 minutes in an ambient atmosphere of 5000 p.p.m. $H_2$ in $CO_2$. It is to be understood, however that equivalent results could be obtained by different combinations and values of these parameters.

In the actual making of such devices, an array of temperature sensitive resistive elements is defined by photolithographic processes which subdivide the film into many identical elements. Electrical contact pads, such as pads 14 in FIG. 1, are deposited and defined by conventional methods, preferably after the annealing process because of the high temperature involved. Aluminum and a combination of nickel-chromium with gold have been successfully used as contact metals. The substrate may then be separated to form individual temperature sensitive resistive elements by scribing and breaking. Electrode wire leads 16 are subsequently welded to the contact pads 14. These temperature sensitive resistive elements are then packaged according to well established techniques to provide protection for the environment and to provide a convenient method of attachment to other circuitry.

Figure 2:
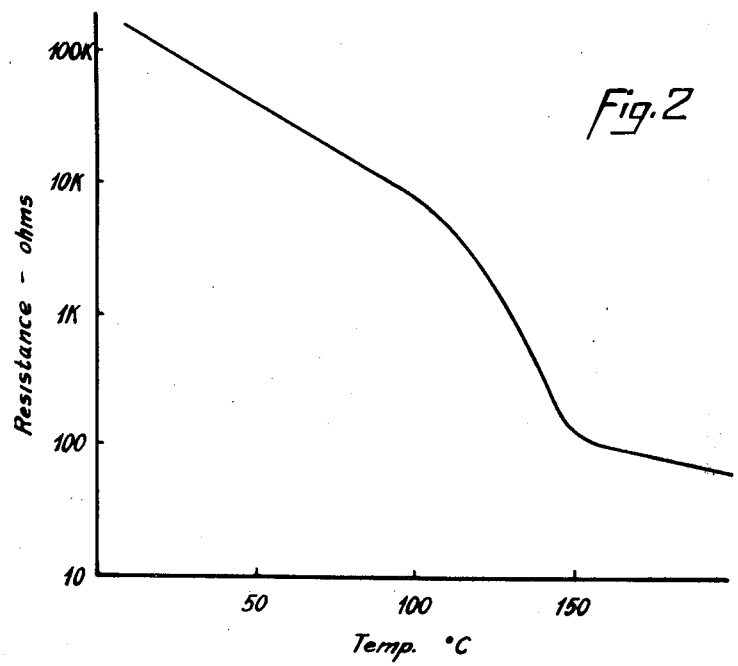
FIG. 2 illustrates the resistance-temperature characteristic of a thin film resistive element.
Figure 3:
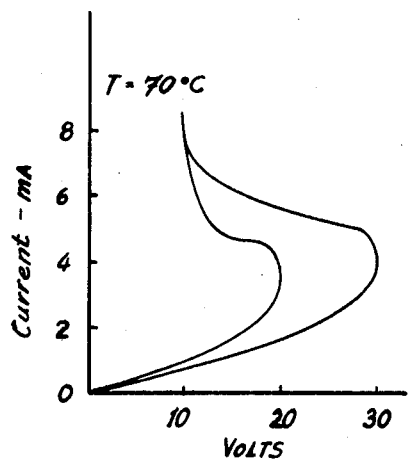
FIGS. 3 and 4 illustrate the current-voltage characteristics of thin film resistive elements at 70°C and 120°C respectively.
Figure 4:
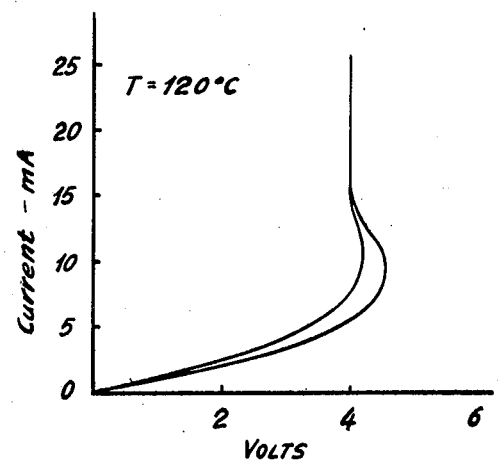

The temperature sensitive element which is obtained can be used in an electronic circuit by responding to small changes in temperature around 140°C with substantial changes in resistance as illustrated in FIG. 2 of the drawings. By connecting to an appropriate circuit element, it may act as a temperature sensor and operate as a solid state switching device when the temperature exceeds 140°C. Current may also be passed through the above disclosed temperature sensitive resistive element to heat it about 140°C and so make it operate as a solid state switching device. In this case it will operate as a bistable switch as long as the environment temperature does not exceed 140°C. As it will be easily understood, the temperature sensitive resistive element will remain in its low resistance state if the environmental temperature remains above 140°C and no switching back to a high impedance state will occur. FIGS. 3 and 4 show current-voltage characteristics of such a device at 70° and 120°C, respectively, showing two distinct impedance states at elevated temperatures.

Although the above disclosed $V_3O_5$ resistive element is made by a reduction process, it is to be understood that it could be made by an oxidation process.

The transition temperature of $V_3O_5$ (140°C) may be increased or lowered by the addition of a suitable doping material such as disclosed in U.S. patent application Ser. No. 384,505 filed Aug. 1, 1973. For example, the addition of about 2 percent germanium has lowered the transition temperature to about 120°C.

Figure 5:
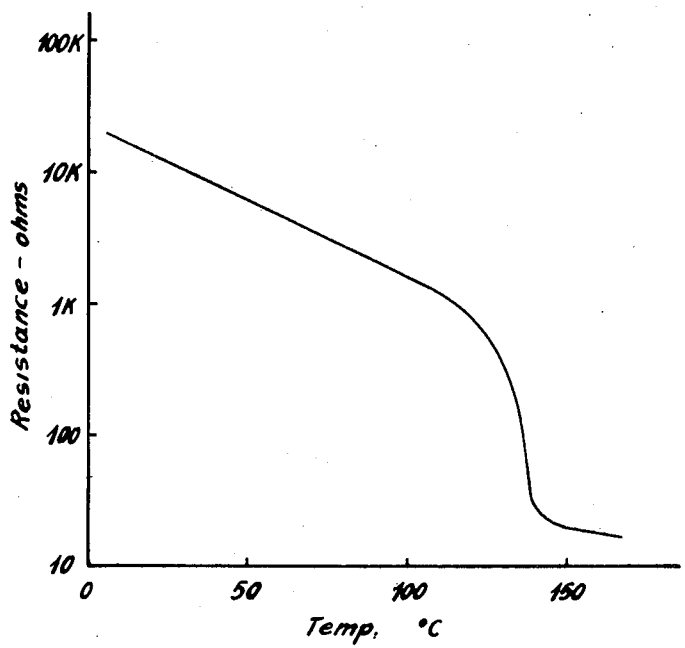
FIG. 5 illustrates the resistance-temperature characteristic of a polycrystalline aggregate.

Although the invention has been disclosed with reference to a temperature sensitive resistive element made in the thin film form, it is to be understood that similar devices may be made in the form of either a single crystal, a polycrystalline aggregate, a sintered powder, or a thick film paste. FIG. 5 illustrates the resistance-temperature characteristic of a temperature sensitive element made in the form of a polycrystalline aggregate.

What is claimed is:

1. A solid state switching device comprising a temperature sensitive resistive element of $V_3O_5$ material which exhibits an abrupt decrease in electrical resistance at about 140°C, and electrode lead wires attached to spaced points of said temperature sensitive resistive element for connecting such temperature sensitive resistive element to an electrical circuit.

2. A solid state switching device as defined in claim 1, wherein the temperature sensitive material is in the form of a thin film deposited on a supporting substrate, and further comprising metallic pads in contact with said temperature sensitive material at said spaced points, said electrode lead wires being welded to said metallic pads.

3. A solid state switching device as defined in claim 1, wherein the temperature sensitive resistive element is selected from the group consisting of a single crystal, a polycrystalline aggregate, a sintered powder and a thick film paste.

4. A solid state switching device as defined in claim 2, wherein the insulating substrate is made of single crystal quartz.

5. A solid state switching device as defined in claim 1, wherein the resistive element of $V_3O_5$ is doped with doping material to increase or decrease the transition temperature.

6. A solid state switching device as defined in claim 5, wherein said doping material is germanium to decrease the transition temperature in the range of 100°–140°C.

* * * * *